United States Patent
Wu et al.

(10) Patent No.: US 6,522,073 B2
(45) Date of Patent: Feb. 18, 2003

(54) PLASMA DISPLAY PANEL WITH AN AUXILIARY BONDING PAD

(75) Inventors: Jiun-Han Wu, Taipei Hsien (TW); Po-Cheng Chen, Taipei Hsien (TW); Chien-Hsing Li, Tai-Chung (TW)

(73) Assignee: AU Optronics Corp., Hsinchu (TW)

( * ) Notice: Subject to any disclaimer, the term of this patent is extended or adjusted under 35 U.S.C. 154(b) by 20 days.

(21) Appl. No.: 09/682,308

(22) Filed: Aug. 16, 2001

(65) Prior Publication Data

US 2002/0024302 A1 Feb. 28, 2002

(30) Foreign Application Priority Data

Aug. 30, 2000 (TW) ........................................ 89117598 A

(51) Int. Cl.⁷ ................................................ H01J 17/49
(52) U.S. Cl. ........................ 313/582; 313/586; 313/587
(58) Field of Search .................................. 313/582, 586, 313/587, 506

*Primary Examiner*—Vip Patel
(74) *Attorney, Agent, or Firm*—Winston Hsu

(57) ABSTRACT

A display panel is disclosed. The display panel includes a substrate having an edge and a printed circuit board. A plurality of bonding electrodes are formed on the substrate, and positioned along the edge of the substrate. Each bonding electrode neither overlaps nor connects with any of the other bonding electrodes. The bonding electrodes are spaced from the edge of the substrate by a distance. A plurality of board electrodes are formed on the printed circuit board. Each board electrode neither overlaps nor connects with any other board electrodes. The position of each board electrode corresponds to that of one of the bonding electrodes. An auxiliary bonding pad is formed between the bonding electrodes and the edge of the substrate. When a conductive adhesive layer and a protective adhesive layer are formed to adhere the substrate with the printed circuit board, the auxiliary bonding pad can reduce a space formed between the bonding electrodes and the conductive adhesive layer, and also eliminates the possibility of the bubble formation therebetween. Therefore, the substrate is completely sealed with the printed circuit board.

9 Claims, 3 Drawing Sheets

PLASMA DISPLAY PANEL WITH AN AUXILIARY BONDING PAD

BACKGROUND OF INVENTION

1. Field of the Invention

The present invention relates to a plasma display panel (PDP), and more particularly, to a plasma display panel with an auxiliary bonding pad.

2. Description of the Prior Art

With the progressive development of the electronics industry, the demand for flat panel displays (FPD) has been increased. The plasma display panel (PDP) has the greatest market potential amongst all FPDs. In the manufacturing process of a PDP, a front substrate is sealed with a rear substrate to form lots of discharge cells therebetween. A plurality of printed circuit boards(PCBs) are then connected with the front substrate or the rear substrate for controlling these discharge cells. The printed circuit boards are used to connect with other electrical devices, so the quality of the PDP will be affected by the reliability and the bonding strength between the printed circuit boards and the front substrate (or the rear substrate).

Please refer to FIG. 1 and FIG. 2. FIG. 1 is a schematic diagram showing a bonding area 16 of a rear substrate 12 in a plasma display panel 10 according to the prior art.

FIG. 2 is a schematic diagram of a process for sealing the rear substrate 12 and a printed circuit board 22 in the prior art. As shown in FIG. 1, the plasma display panel 10 includes a front substrate (not shown) and a rear substrate 12 parallel to and spaced apart from the front substrate. A bonding area 16 is defined out of the area that the rear substrate 12 sealed with the front substrate. The bonding area 16 is connected to a printed circuit board 22. A plurality of bonding electrodes 14 is formed on the bonding area 16 and electrically connected with the printed circuit board 22. As shown in FIG. 2, a plurality of board electrodes 24 is formed on the printed circuit board. These board electrode 24 don't connect to each other. Each board electrodes 24 is positioned corresponding to one of the bonding electrodes 14. An anisotropic conductive film(ACF) 26, having conductive particles, fills the space between the rear substrate 12 and the printed circuit board 22 so as to connect the rear substrate 12 with the printed circuit board 22 electrically and physically.

Please refer to FIG. 3. FIG. 3 is a schematic diagram of the sealing structure of the rear substrate 12 and the printed circuit board 22. At the final step of the sealing process, a layer of silicon paste 29 is coated between the rear substrate 12 and the printed circuit board 22. The silicon paste 29 is used to protect the ACF 26 from the air and to strengthen the connection between the rear substrate 12 and the printed circuit board 22. However, in the PDP 10 formed by the prior art method, a space 27 is usually formed between the ACF 26 and the front end of the bonding electrode 14, and therefore an inner silicon paste 291 fails to contact with the substrate 12 or the board electrodes 24. Thus, the inner silicon paste 291 fails to adhere the rear substrate 12 to the printed circuit board 22. Besides, after the silicon paste 29 is formed, the moisture may exist in the air of the space 27. This moisture will influence the bonding properties of the ACF 26 so that the ACF 26 may be peeled off from the bonding electrodes 14 or the board electrodes 24. Therefore, the bonding electrodes 14 and the board electrodes 24 may fail to remain electrically connected, or the moisture may reduce the bonding effect of the silicon paste 29, so the reliability of the PDP is affected.

SUMMARY OF INVENTION

It is therefore an object of the present invention to provide a plasma display panel (PDP) having an auxiliary bonding pad to solve the above-mentioned problems.

According to the present invention, a plasma display panel includes a substrate and a printed circuit board. The substrate has an edge, and a plurality of bonding electrodes are formed on the substrate along the edge of the substrate. Each bonding electrode neither overlaps with any of the other bonding electrodes nor electrically connects to any of the other bonding electrode. The bonding electrodes are spaced from the edge of the substrate by a distance. Further, a plurality of board electrodes is formed on the printed circuit board. Each board electrode neither overlaps nor connects to any of the other bonding electrode. The position of each board electrode corresponds to the position of a corresponding bonding electrode. Beside, an auxiliary bonding pad is formed between the bonding electrodes and the edge of the substrate. When a conductive adhesive layer and a protective adhesive layer are formed to adhere the substrate with the printed circuit board, the auxiliary bonding pad can reduce a space formed between the bonding electrodes and the conductive adhesive layer, and also eliminates the possibility of the bubble formation therebetween. Therefore, the substrate is completely sealed with the printed circuit board.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
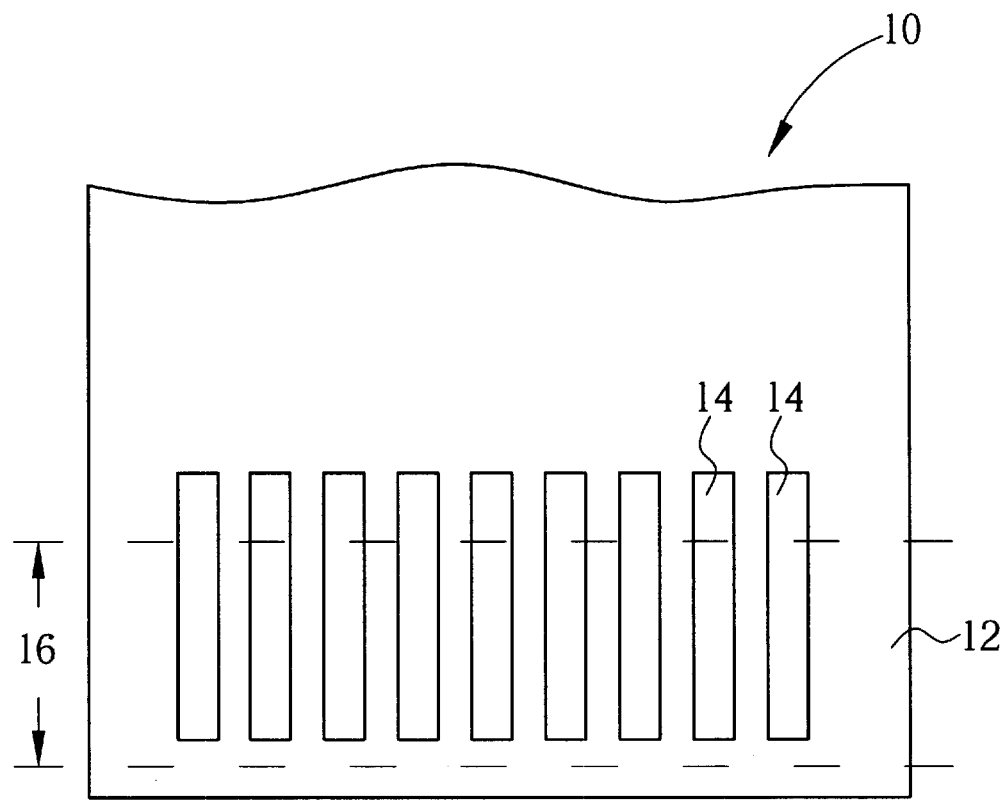
FIG. 1 is a schematic diagram showing a bonding area on a rear substrate of a plasma display panel in the prior art.
Figure 2:
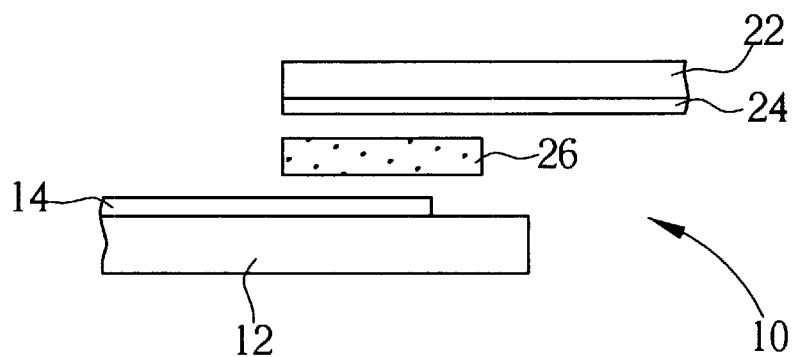
FIG. 2 is a schematic diagram of a process for sealing a rear substrate and a printed circuit board in the prior art.
Figure 3:
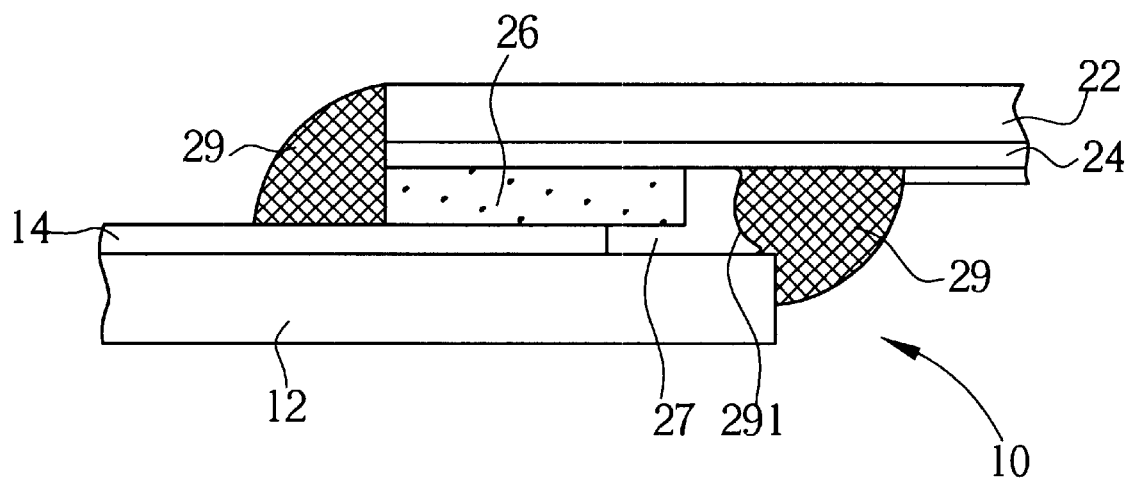
FIG. 3 is the schematic diagram showing a sealing structure of a rear substrate and a printed circuit board in the prior art.
Figure 4:
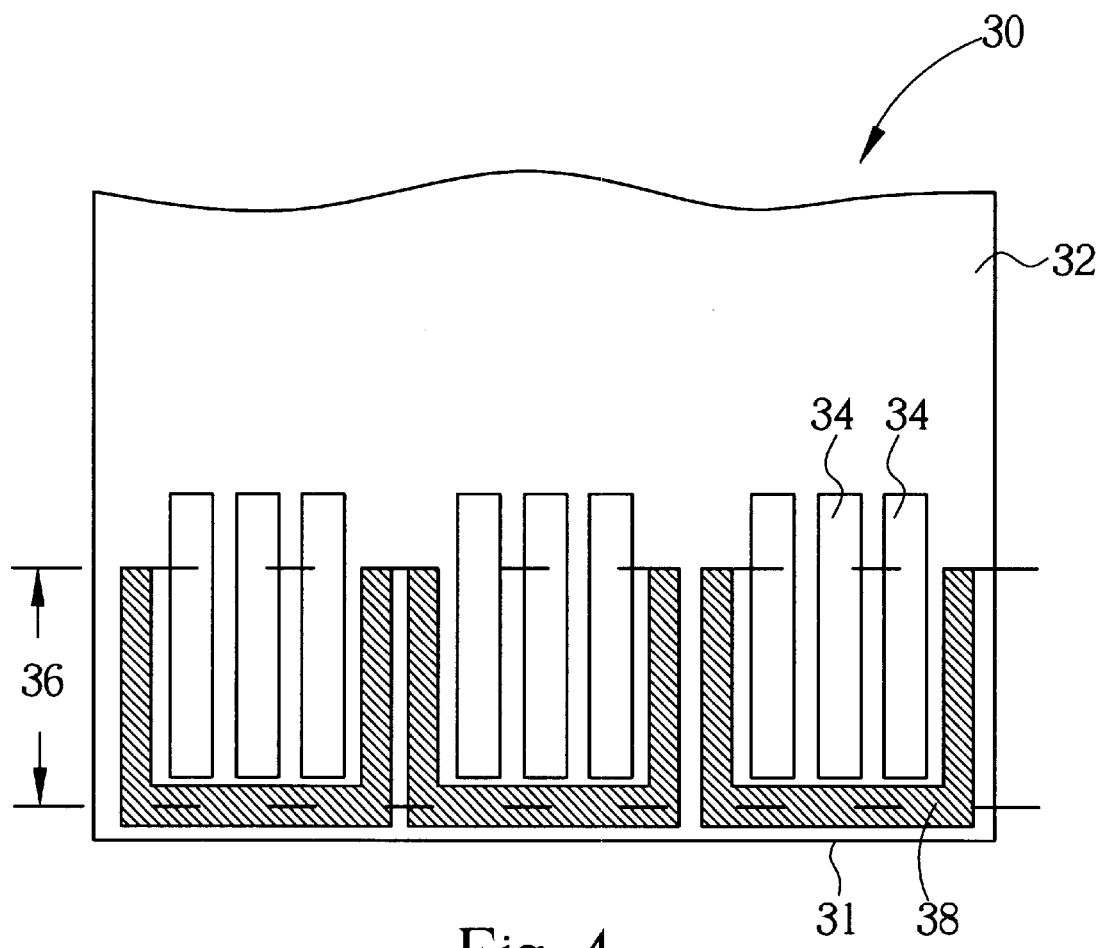
FIG. 4 is a schematic diagram showing a bonding area on a rear substrate of a plasma display panel in the present invention.

Please refer to FIG. 4. FIG. 4 is a schematic diagram showing a bonding area on a rear substrate of a plasma display panel in the present invention. As shown in FIG. 4, a plasma display panel 30 includes a front substrate (not shown), and a rear substrate 32 parallel to and spaced apart from the front substrate. A bonding area 36 is defined out of a sealing area (not shown in the drawing) on the rear substrate 32. A plurality of parallel bonding electrodes 34 are formed along the edge of the rear substrate 32. Each bonding electrode 34 does not overlap with any other bonding electrodes 34 in the bonding area 36, so that each bonding electrode is not electrically connected with other boding electrodes 34. Each bonding electrode 34 has a rectangular shape, and is spaced from the edge 31 of the rear substrate 32 by a distance. Additionally, a plurality of auxiliary bonding pad 38 are formed between the bonding electrodes 34 and the edge 31 of the rear substrate 32. The bonding electrodes 34 are divided into several groups. In the preferred embodiment, three bonding electrodes 34 make a group. Each auxiliary bonding pad 38 is in an U-shape and positioned at three sides of each group of the bonding electrodes 34, as shown in FIG. 4.

Figure 5:
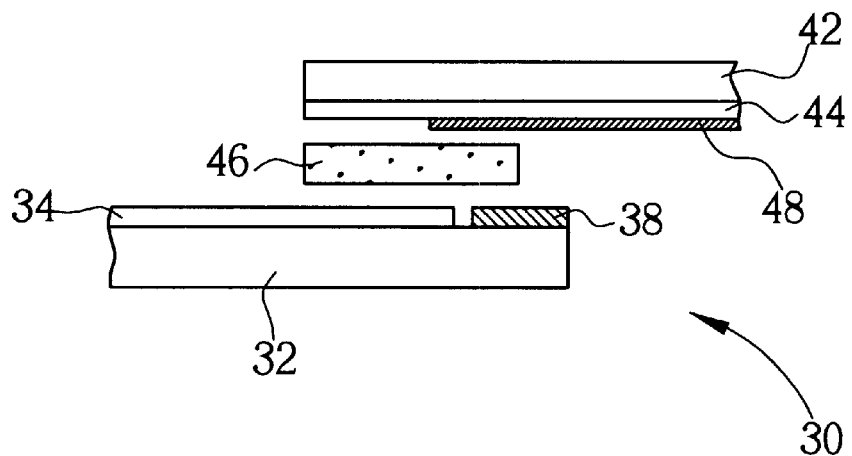
FIG. 5 is the schematic diagram of a process for sealing a rear substrate and a printed circuit board in the present invention.
Figure 6:
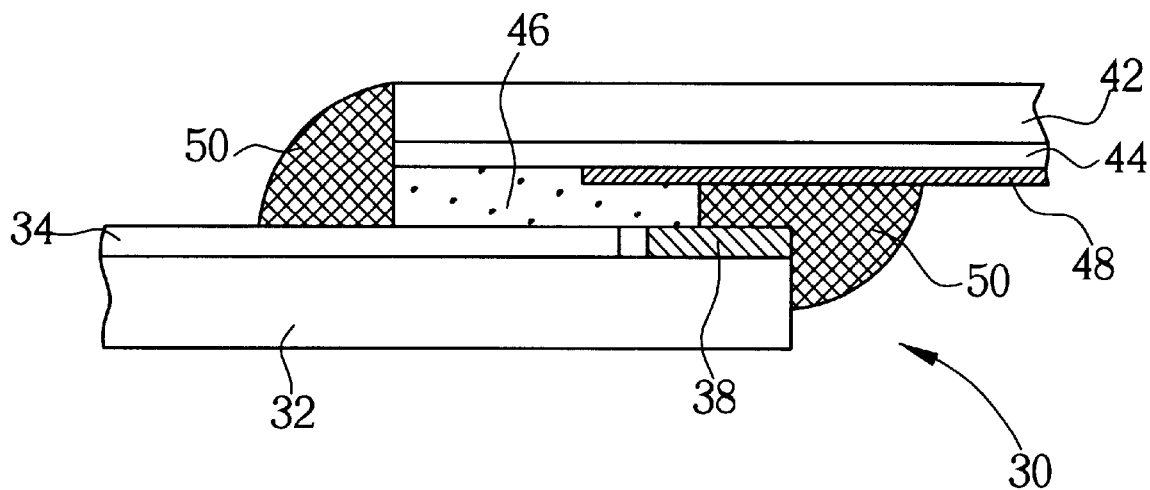
FIG. 6 is the schematic diagram showing a sealing structure of a rear substrate and a printed circuit board of the present invention.

Please refer to FIG. 5 and FIG. 6. FIG. 5 is a schematic diagram showing a process for sealing the rear substrate 32 and a printed circuit board 42 of the plasma display panel 30. FIG. 6 is a schematic diagram showing a sealing structure of the rear substrate 32 and the printed circuit board 42. As shown in FIG. 5, the printed circuit board 42 is a flexible printed circuit (FPC) board, and the printed circuit board 42 also has a plurality of board electrodes 44 parallel to each other and formed on the surface of the FPC board. Each board electrode 44 neither overlaps nor connects with any other board electrode 44 on the printed circuit board 42. The position of each board electrodes 44 corresponds to the position of the corresponding one of the bonding electrodes 34. A conductive adhesive layer 46 is further formed between the rear substrate 32 and the printed circuit board 42. The conductive adhesive layer 46 is an anisotropic conductive film (ACF) 46 having the conductive particles for adhering the rear substrate 32 to the printed circuit board 42 and electrically connecting the bonding electrodes 34 and the board electrodes 44. After a thermal and high-pressure process, the conductive particles of the ACF 46 are embedded into the board electrodes 44 and the bonding electrodes 34. In the embodiments, the metal particles having a nickel-plating or gilding cover are chosen to form the main conductive particles. Gilding over is used to increase the electrically conductivity of the conductive particles. Nickel-plating cover is used to increase the hardness of the conductive particles. The hardness of the conductive particles is greater than the hardness of the auxiliary bonding pad 38 for sealing the rear substrate 32 and the printed circuit board 42 by the ACF 46.

In this embodiment, the auxiliary bonding pad 38 are made by the same material of the bonding electrodes so that the auxiliary bonding pad 38 and the bonding electrodes 34 can be manufactured by the same process, and the cost can be reduced. Because the material used for forming the auxiliary bonding pad 38 and the bonding electrodes 34 is conductive, an insulating layer 48 is further formed above the board electrodes 44 so as to prevent short circuits between the board electrodes 44 and the auxiliary bonding pad 38. On the other hand, the auxiliary bonding pad 38 can be made by an insulating material, and therefore, no insulating layer is needed above the board electrodes 44.

As shown in FIG. 6, after adhering the rear substrate 32 and the printed circuit board 42 by the conductive adhesive layer 46, a protective adhesive layer 50 is formed between the rear substrate 32 and the printed circuit board 42 and connected to the conductive adhesive layer 46. The protective adhesive layer 50 can protect the conductive adhesive layer 46 from air, and seal the rear substrate 32 and the printed circuit board 42. The protective adhesive layer 50 is a silicon paste 50, and seal the void between the rear substrate 32 and the printed circuit board 42, thus can improve the waterproof, the moisture proof, and the sealing strength of the PDP 30. Because of the auxiliary bonding pad 38, the space between the bonding electrodes 34 and the conductive adhesive layer 46 can be reduced or eliminated, and no bubbles is easily generated among the silicon paste 50, the conductive adhesive layer 46, and the front end of the bonding electrodes 34. The rear substrate 32 and the printed circuit board 42 are thus completely sealed.

In the present invention, an auxiliary bonding pad 38 is formed around the bonding electrodes 34 to ensure that no bubbles will be generated between the rear substrate 32 and the printed circuit board 42. Therefore, the reliability and the strength of the sealing process will be improved. The advantages of the plasma display panel 30 in the present invention are listed below.

(1) The bonding strength is increased. As shown in FIG. 6, the auxiliary bonding pad 38 is formed in the space between the conductive adhesive layer 46 and the front end of the bonding electrodes 34. In the prior art, only the area that the conductive adhesive layer 46 contacts the bonding electrode 34 is defined as the adhesive area of the conductive adhesive layer 46 for adhering the rear substrate 32 to the printed circuit board 42. In the present invention, the adhesive area further includes the area where the conductive adhesive layer 46 contacts the auxiliary bonding pad 38, and therefore, the bonding strength between the rear substrate 32 and the printed circuit board 42 is increased.

(2) The bonding reliability is increased. In the prior art, bubbles are easily generated in the vacant space 27 in front of the bonding electrodes 14 after the anisotropic conductive film 26 and the silicon paste are formed, and the sealing quality of the silicon paste 29 is reduced. Moreover, the anisotropic conductive film 26 is exposed to the air, which also influences the reliability of the PDP. The present invention uses the auxiliary bonding pad 38 formed in the above-mentioned space so as to prevent the bubbles. Therefore, the conductive adhesive layer 46, the auxiliary bonding pad 38, and the silicon paste 50 can be sealed together. It is also reduce the damage of the silicon paste caused by the moisture or water, thus increasing the overall reliability of the PDP.

In contrast to the prior art, the present invention provides the auxiliary bonding pad 38 around the bonding electrodes 34 to prevent bubbles formed during the sealing process. Consequently, the bonding strength and the reliability of the plasma display panel are increased.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A plasma display panel comprising:

a substrate having an edge;

a plurality of bonding electrodes formed on the substrate, the bonding electrodes being positioned along the edge of the substrate, each bonding electrode beingunconnected to each other, and the bonding electrodes being-spaced the edge of the substrate for a distance;

an auxiliary bonding pad formed between the bonding electrodes and the edge of the substrate;

a printed circuit board;

a plurality of board electrodes formed on the printed circuit board,the board electrodes beingunconnected to each other, the position of the board electrodes corresponding to the position of the bonding electrodes;

a conductive adhesive layer formed between the bonding electrodes and the board electrodes, the conductive adhesive layer adhering the substrate to the printed circuit board so as to electrically connect the bonding electrodes to the board electrodes; and a protective adhesive layer formed between the substrate and the printed circuit board, the protective adhesive layer being connected with the conductive adhesive layer so as to protect the conductive adhesive layer from the air.

2. The plasma display panel of claim 1 wherein the conductive adhesive layer is an anisotropic conductive film (ACF) comprising conductive particles for electrically connecting the bonding electrodes and the board electrodes.

3. The plasma display panel of claim 2 wherein the protective adhesive layer is a silicon paste for filling that adheres the substrate to the printed circuit board adhering the substrate with the printed circuit board.

4. The plasma display panel of claim 3 wherein the auxiliary bonding pad is formed between the bonding electrodes and the silicon paste to ensure that no bubbles are generated between the silicon paste and the anisotropic conductive film.

5. The plasma display panel of claim 1 wherein the auxiliary bonding pad is made by the same material of the bonding electrodes.

6. The plasma display panel of claim 5 wherein the printed circuit further comprises an insulating layer formed thereon, the insulating layer is used to prevent a connection between the board electrodes and the auxiliary bonding pad.

7. The plasma display panel of claim 1 wherein the auxiliary bonding pad is made by an insulating material.

8. The plasma display panel of claim 1 wherein the board electrodes and the bonding electrodes have a substantially rectangular shape, and the auxiliary bonding pad is substantially U-shaped.

9. The plasma display panel of claim 1 wherein the printed circuit board is a flexible printed circuit (FPC) board.

* * * * *